(12) United States Patent
Cho et al.

(10) Patent No.: US 11,335,406 B2
(45) Date of Patent: May 17, 2022

(54) MEMORY DEVICE FOR PERFORMING PROGRAM VERIFY OPERATION AND METHOD OF OPERATING THE SAME

(71) Applicant: SK hynix Inc., Icheon-si (KR)

(72) Inventors: Sung Hoon Cho, Icheon-si (KR); Jae Sung Sim, Icheon-si (KR); Se Kyoung Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/075,589

(22) Filed: Oct. 20, 2020

(65) Prior Publication Data

US 2021/0366550 A1  Nov. 25, 2021

(30) Foreign Application Priority Data

May 21, 2020  (KR) .................... 10-2020-0061155

(51) Int. Cl.
*G11C 16/04* (2006.01)
*G11C 16/10* (2006.01)
*G11C 11/56* (2006.01)
*G11C 16/34* (2006.01)

(52) U.S. Cl.
CPC .......... *G11C 16/10* (2013.01); *G11C 11/5628* (2013.01); *G11C 11/5671* (2013.01); *G11C 16/0483* (2013.01); *G11C 16/3459* (2013.01)

(58) Field of Classification Search
CPC . G11C 16/10; G11C 16/3459; G11C 11/5671; G11C 16/0483; G11C 11/5628
USPC ..................................................... 365/185.17
See application file for complete search history.

(56) References Cited

U.S. PATENT DOCUMENTS

| 2008/0084748 A1* | 4/2008 | Hemink ............... G11C 11/5628 365/185.28 |
| 2011/0090739 A1* | 4/2011 | Goda .................. G11C 16/0483 365/185.17 |
| 2012/0081963 A1* | 4/2012 | Dutta ..................... G11C 16/10 365/185.17 |

FOREIGN PATENT DOCUMENTS

| KR | 1020140104186 A | 8/2014 |
| KR | 1020190120502 A | 10/2019 |

* cited by examiner

*Primary Examiner* — Tha-O H Bui
(74) *Attorney, Agent, or Firm* — William Park & Associates Ltd.

(57) ABSTRACT

Provided herein may be a memory device and a method of operating the same. The memory device may include a plurality of cell strings, a peripheral circuit, and control logic. Each of the cell strings includes a drain select transistor, a source select transistor, and a plurality of memory cells that are coupled in series between the drain select transistor and the source select transistor. The peripheral circuit may be configured to perform a program operation and a program verify operation on a cell string that is selected from among the plurality of cell strings. The control logic may be configured to control the peripheral circuit to boost a channel voltage of at least one unselected cell string, among the plurality of cell strings, based on a comparison between a degree of progress of the program operation and a reference degree of progress during the program verify operation.

20 Claims, 18 Drawing Sheets

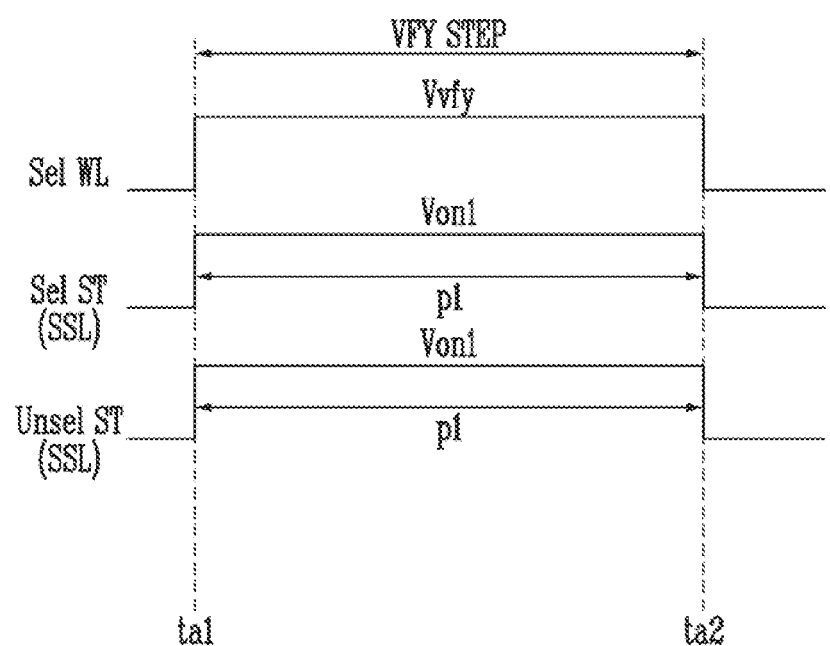

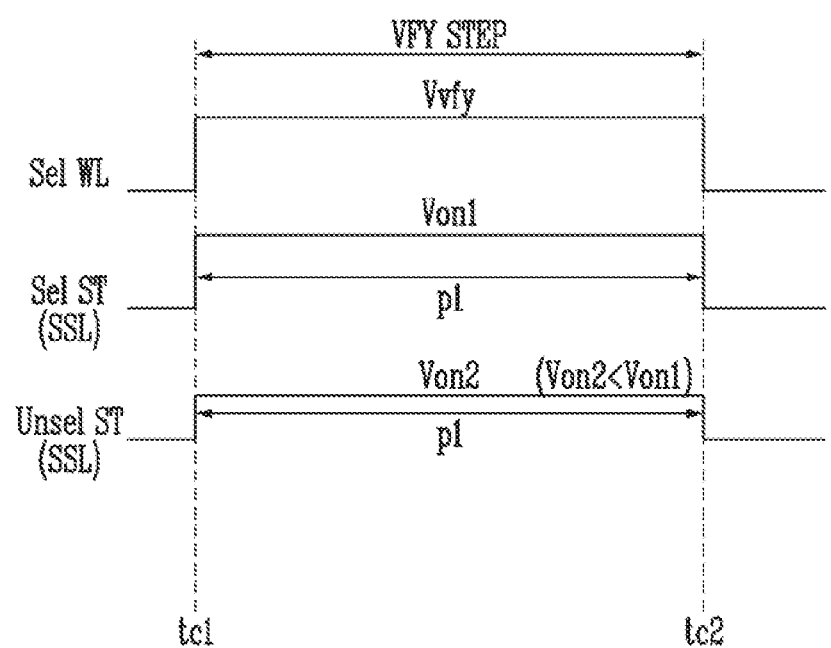

MEMORY DEVICE FOR PERFORMING PROGRAM VERIFY OPERATION AND METHOD OF OPERATING THE SAME

CROSS-REFERENCE TO RELATED APPLICATION

The present application claims priority under 35 U.S.C. § 119(a) to Korean patent application number 10-2020-0061155, filed on May 21, 2020, in the Korean Intellectual Property Office, the entire disclosure of which is incorporated herein by reference.

BACKGROUND

1. Technical Field

Various embodiments of the present disclosure generally relate to an electronic device, and more particularly to a memory device and a method of operating the memory device.

2. Related Art

A storage device is a device that stores data based on a host device, such as a computer or a smartphone. The storage device may include a memory device in which data is stored and a memory controller that controls the memory device. Such memory devices are classified into a volatile memory device and a nonvolatile memory device.

The volatile memory device is a memory device in which data is stored only when power is supplied and in which the stored data is lost when the supply of power is interrupted. Examples of the volatile memory device include a static random access memory (SRAM) and a dynamic random access memory (DRAM).

The nonvolatile memory device is a memory device in which stored data is retained even when the supply of power is interrupted. Examples of the nonvolatile memory device include a read only memory (ROM), a programmable ROM (PROM), an electrically programmable ROM (EPROM), an electrically erasable and programmable ROM (EEPROM), and a flash memory.

SUMMARY

An embodiment of the present disclosure may provide for a memory device. The memory device may include a plurality of cell strings, a peripheral circuit, and a control logic. Each of the plurality of cell strings includes a drain select transistor, a source select transistor, and a plurality of memory cells that are coupled in series between the drain select transistor and the source select transistor. The peripheral circuit is configured to perform a program operation and a program verify operation on a cell string that is selected from among the plurality of cell strings. The control logic is configured to control the peripheral circuit to boost a channel voltage of at least one unselected cell string, among the plurality of cell strings, based on a comparison between a degree of progress of the program operation and a reference degree of progress during the program verify operation.

An embodiment of the present disclosure may provide for a memory device. The memory device may include first to fourth cell strings, a peripheral circuit, and a control logic. Each of the first to fourth cell strings includes a drain select transistor, a source select transistor, and a plurality of memory cells that are coupled in series between the drain select transistor and the source select transistor. The peripheral circuit is configured to perform a program operation and a program verify operation on memory cells in the first cell string. The control logic is configured to control the peripheral circuit to boost channel voltages of the third and fourth cell strings based on a comparison between a degree of progress of the program operation and a reference degree of progress during the program verify operation, wherein respective source select transistors that are included in the first and second cell strings are coupled to a first source select line, and wherein respective source select transistors that are included in the third and fourth cell strings are coupled to a second source select line.

An embodiment of the present disclosure may provide for a method of operating a memory device including a plurality of cell strings, each including a drain select transistor, a source select transistor, and a plurality of memory cells coupled in series between the drain select transistor and the source select transistor. The method may include performing a program operation on a cell string selected from among the plurality of cell strings, and controlling a boosting of a channel voltage of at least one unselected cell string, among the plurality of cell strings, based on a comparison between the degree of progress of the program operation and a reference degree of progress during a program verify operation that is performed on the selected cell string.

BRIEF DESCRIPTION OF THE DRAWINGS

FIG. 13A is a timing diagram, illustrating a voltage applied to a source select line that is coupled to a source select transistor of an unselected cell string during a program verify operation, according to an embodiment.

FIG. 13C is a timing diagram, illustrating a voltage applied to a source select line that is coupled to a source select transistor of an unselected cell string during a program verify operation, according to an embodiment.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device with improved program verify operation performance and a method of operating the memory device.

Figure 1:
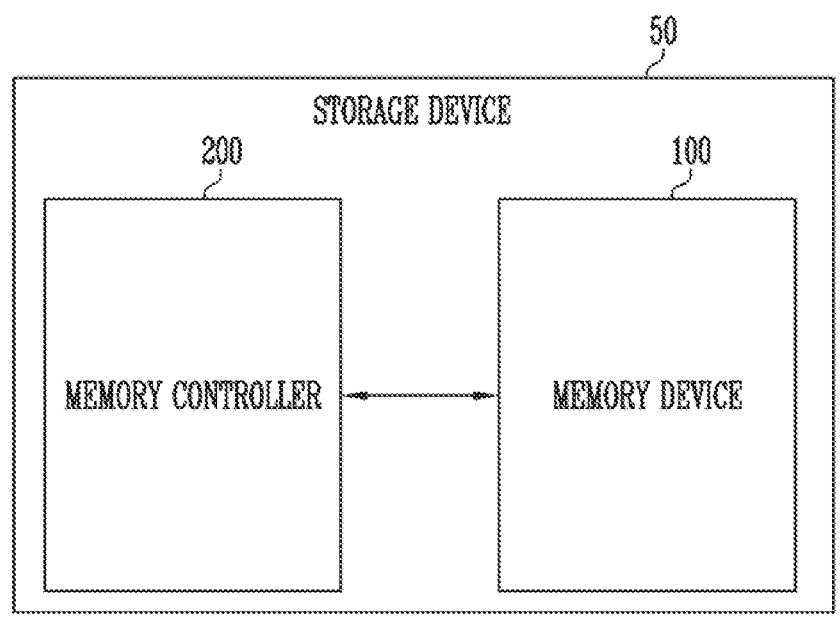
FIG. 1 is a diagram, illustrating a storage device, according to an embodiment of the present disclosure.

FIG. 1 is a diagram, illustrating a storage device, according to an embodiment of the present disclosure.

Referring to FIG. 1, a storage device 50 may include a memory device 100 and a memory controller 200 that controls the operation of the memory device. The storage device 50 may be a device that stores data based on a host such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices that depend on a host interface for communication with the host.

The storage device 50 may be implemented as any one of various types of storage devices, such as a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured and packaged as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated based on the memory controller 200. The memory device 100 may include a memory cell array with a plurality of memory cells that store data.

Each of the memory cells may be implemented as a single-level cell (SLC) that is capable of storing a single data bit, a multi-level cell (MLC) that is capable of storing two data bits, a triple-level cell (TLC) that is capable of storing three data bits, or a quad-level cell (QLC) that is capable of storing four data bits.

The memory cell array may include a plurality of memory blocks. Each memory block may include a plurality of memory cells. A single memory block may include a plurality of pages. In an embodiment, a page may be a unit of measurement by which data is stored in the memory device 100 or by which data that is stored in the memory device 100 is read.

A memory block may be a unit of measurement by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may receive a command and an address from the memory controller 200, and may access the area of the memory cell array that is selected by the address. That is, the memory device 100 may perform an operation that is indicated by the command on the area that is selected by the address. For example, the memory device 100 may perform a write operation (i.e., program operation), a read operation, and an erase operation. During a program operation, the memory device 100 may program data to the area that is selected by the address. During a read operation, the memory device 100 may read data from the area that is selected by the address. During an erase operation, the memory device 100 may erase data that is stored in the area that is selected by the address.

The memory controller 200 may control the overall operation of the storage device 50.

When power is applied to the storage device 50, the memory controller 200 may run firmware (FW). When the memory device 100 is a flash memory device, the memory controller 200 may run firmware, such as a Flash Translation Layer (FTL) for controlling the communication between the host and the memory device 100.

In an embodiment, the memory controller 200 may receive data and a logical block address (LBA) from the host and may translate the logical block address (LBA) into a physical block address (PBA), indicating the address of memory cells that are included in the memory device 100 and in which data is to be stored.

The memory controller 200 may control the memory device 100 so that a program operation, a read operation, or an erase operation is performed based on a request that is received from the host. During a program operation, the memory controller 200 may provide a write command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a command, an address, and data, regardless of whether a request from the host is received, and may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 by using an interleaving scheme to improve operating performance. The interleaving scheme may be an operating manner in which the operating periods of at least two memory devices 100 are caused to overlap each other.

The host may communicate with the storage device 50 by using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
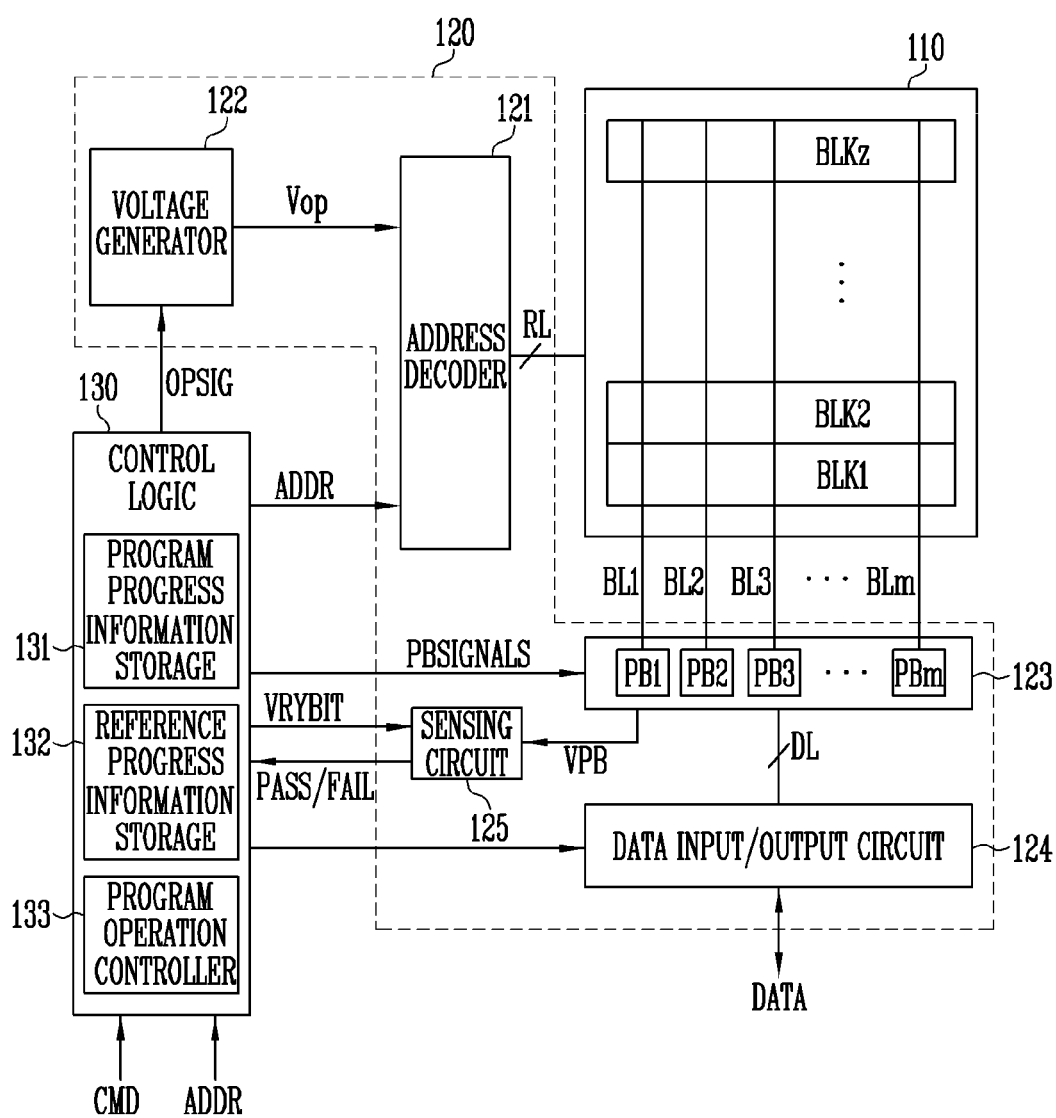
FIG. 2 is a diagram, illustrating the structure of a memory device of FIG. 1.

FIG. 2 is a diagram, illustrating the structure of the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz may be coupled to an address decoder 121 through row lines RL. The memory blocks BLK1 to BLKz are coupled to a read and write circuit 123 through bit lines BL1 to BLm. Each of the memory blocks BLK1 to BLKz may include a plurality of memory cells. In an embodiment, the plurality of memory cells are nonvolatile memory cells. In the plurality of memory cells, memory cells that are coupled to the same word line are defined as a single physical page. That is, the memory cell array 110 may be composed of a plurality of physical pages. In accordance with an embodiment of the present disclosure, each of the plurality of memory blocks BLK1 to BLKz that is included in the memory cell array 110 may include a plurality of dummy cells. One or more dummy cells may be coupled in series between a drain select transistor and the memory cells and between a source select transistor and the memory cells.

Each of the memory cells of the memory device 100 may be implemented as a single-level cell (SLC) that is capable of storing a single data bit, a multi-level cell (MLC) that is capable of storing two data bits, a triple-level cell (TLC) that is capable of storing three data bits, or a quad-level cell (QLC) that is capable of storing four data bits.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 so that a program operation, a read operation, and an erase operation are performed.

The address decoder 121 may be coupled to the memory cell array 110 through row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated based on the control logic 130. The address decoder 121 may receive addresses ADDR from the control logic 130.

The address decoder 121 may decode a block address, among the received addresses ADDR. The address decoder 121 may select at least one of the memory blocks BLK1 to BLKz based on the decoded block address. The address decoder 121 may decode a row address among the received addresses ADDR. The address decoder 121 may select at least one of word lines of the selected memory block based on the decoded row address. The address decoder 121 may apply operating voltages Vop that are supplied from the voltage generator 122 to the selected word line.

During a program operation, the address decoder 121 may apply a program voltage to the selected word line and may apply a pass voltage with a level that is lower than that of the program voltage to unselected word lines. During a program verify operation, the address decoder 121 may apply a verify voltage to a selected word line and apply a verify pass voltage with a level that is higher than that of the verify voltage to unselected word lines.

During a read operation, the address decoder 121 may apply a read voltage to a selected word line and apply a read pass voltage with a level that is higher than that of the read voltage to unselected word lines.

In accordance with an embodiment of the present disclosure, the erase operation of the memory device 100 may be performed based on the unit of memory blocks. During an erase operation, the addresses ADDR that is input to the memory device 100 may include a block address. The address decoder 121 may decode the block address and select a single memory block based on the decoded block address. During the erase operation, the address decoder 121 may apply a ground voltage to word lines that are coupled to the selected memory block.

In accordance with an embodiment of the present disclosure, the address decoder 121 may decode a column address among the received addresses ADDR. The decoded column address may be transferred to the read and write circuit 123. In an embodiment, the address decoder 121 may include components, such as a row decoder, a column decoder, and an address buffer.

The voltage generator 122 may generate a plurality of operating voltages Vop by using an external supply voltage that is supplied to the memory device 100. The voltage generator 122 may be operated based on the control logic 130.

In an embodiment, the voltage generator 122 may generate an internal supply voltage by regulating the external supply voltage. The internal supply voltage that is generated by the voltage generator 122 may be used as an operating voltage for the memory device 100.

In an embodiment, the voltage generator 122 may generate the plurality of operating voltages Vop by using the external supply voltage or the internal supply voltage. The voltage generator 122 may generate various voltages that are required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop with various voltage levels, and may generate the plurality of operating voltages Vop by selectively enabling the plurality of pumping capacitors based on the control logic 130.

The generated operating voltages Vop may be supplied to the memory cell array 110 by the address decoder 121.

The read and write circuit 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may be operated based on the control logic 130.

The first to m-th page buffers PB1 to PBm may perform data communication with the data input/output circuit 124. During a program operation, the first to m-th page buffers PB1 to PBm may receive data DATA to be stored through the data input/output circuit 124 and data lines DL.

During a program operation, when a program pulse is applied to a selected word line, the first to m-th page buffers PB1 to PBm may transfer the data DATA to be stored, received through the data input/output circuit 124, to selected memory cells through the bit lines BL1 to BLm. Memory cells in a selected page may be programmed based on the received data DATA. Memory cells that are coupled to a bit line to which a program permission voltage (e.g., a ground voltage) is applied may have increased threshold voltages. The threshold voltages of memory cells that are coupled to a bit line to which a program inhibit voltage (e.g., a supply voltage) is applied may be maintained. During a program verify operation, the first to m-th page buffers PB1 to PBm may read the data DATA that is stored in the selected memory cells from the selected memory cells through the bit lines BL1 to BLm.

During a read operation, the read and write circuit 123 may read data DATA from the memory cells in the selected page through the bit lines BL1 to BLm and may store the read data DATA in the first to m-th page buffers PB1 to PBm.

During an erase operation, the read and write circuit 123 may allow the bit lines BL1 to BLm to float. In an embodiment, the read and write circuit 123 may include a column select circuit.

The data input/output circuit 124 may be coupled to the first to m-th page buffers PB1 to PBm through the data lines DL. The data input/output circuit 124 may be operated based on the control logic 130.

The data input/output circuit 124 may include a plurality of input/output buffers (not illustrated) that receive input data DATA. During a program operation, the data input/output circuit 124 may receive the data DATA to be stored from an external controller (not illustrated). During a read operation, the data input/output circuit 124 may output the data DATA, received from the first to m-th page buffers PB1 to PBm that are included in the read and write circuit 123, to the external controller.

During a read operation or a verify operation, the sensing circuit 125 may generate a reference current based on an enable bit signal VRYBIT that is generated by the control logic 130 and may output a pass signal or a fail signal to the control logic 130 by comparing a sensing voltage VPB that is received from the read and write circuit 123 with a reference voltage that is generated by the reference current.

The control logic 130 may be coupled to the address decoder 121, the voltage generator 122, the read and write circuit 123, the data input/output circuit 124, and the sensing circuit 125. The control logic 130 may control the overall operation of the memory device 100. The control logic 130 may be operated based on a command CMD transmitted from an external device.

The control circuit 130 may control the peripheral circuit 120 by generating various types of signals based on the command CMD and the addresses ADDR. For example, the control logic 130 may generate an operation signal OPSIG, an address ADDR, read and write circuit control signals PBSIGNALS, and an enable bit VRYBIT based on the command CMD and the addresses ADDR. The control logic 130 may output the operation signal OPSIG to the voltage generator 122, may output the address ADDR to the address decoder 121, may output the read and write circuit control signals PBSIGNALS to the read and write circuit 123, and may output the enable bit VRYBIT to the sensing circuit 125. In addition, the control logic 130 may determine whether a verify operation has passed or failed based on the pass or fail signal PASS or FAIL that is output from the sensing circuit 125.

In an embodiment, the control logic 130 may include a program progress information storage 131, a reference progress information storage 132, and a program operation controller 133.

The program progress information storage 131 may store information regarding the degree of progress of a program operation that is performed by the memory device 100. In an embodiment, the degree of progress of the program operation may be a program loop count for the program operation, as will be described later with reference to FIG. 10. In an embodiment, the degree of progress of the program operation may be a program verify level for the program operation, as will be described later with reference to FIG. 8.

The reference progress information storage 132 may store information regarding the reference degree of progress (i.e., reference degree of progress) of a program operation. In an embodiment, the reference degree of progress may be a reference program loop count, as will be described later with reference to FIG. 10. In an embodiment, the reference degree of progress may be a reference program verify level, as will be described later with reference to FIG. 8.

The program operation controller 133 may control the peripheral circuit 120 so that a program operation and a program verify operation are performed on a cell string that is selected from among the plurality of cell strings that are included in the memory cell array 110.

The program operation controller 133 may control the boosting of the channel voltage of at least one unselected cell string, among the plurality of cell strings, during the program verify operation. The program operation controller 133 may determine whether the degree of progress of the program operation is equal to or higher than the reference degree of progress, based on the information regarding the degree of progress of the program operation and the information regarding the reference degree of progress. The program operation controller 133 may control the boosting of the channel voltage of the at least one unselected cell string, based on the result of a comparison between the degree of progress of the program operation and the reference degree of progress.

For example, when the degree of progress of the program operation is lower than the reference degree of progress, the program operation controller 133 may boost the channel voltage of the unselected cell string while a program verify operation is performed on the selected cell string. When the channel voltage of the unselected cell string is boosted, the difference between the voltages of a word line and a channel may be reduced. When the difference between the voltages of the word line and the channel is reduced, a capacitance component between the word line and the channel may be decreased, and thus the time required for the program verify operation may be shortened.

For example, when the degree of progress of the program operation is equal to or higher than the reference degree of progress, the program operation controller 133 may mitigate the boosting of the channel voltage of the unselected cell string while the program verify operation is performed on the selected cell string. The channel voltage of the unselected cell string that appears when the degree of progress of the program operation is equal to or higher than the reference degree of progress may be boosted higher than the channel voltage of the unselected cell string that appears when the degree of progress of the program operation is lower than the reference degree of progress. In this case, due to the highly boosted channel voltage, memory cells to which a program verify voltage or a program pass voltage is applied may be slightly erased. Therefore, when the degree of progress of the program operation is equal to or higher than the reference degree of progress, the boosting of the channel voltage of the unselected cell string may be mitigated, and thus a phenomenon in which the memory cells are slightly erased may be improved.

Figure 3:
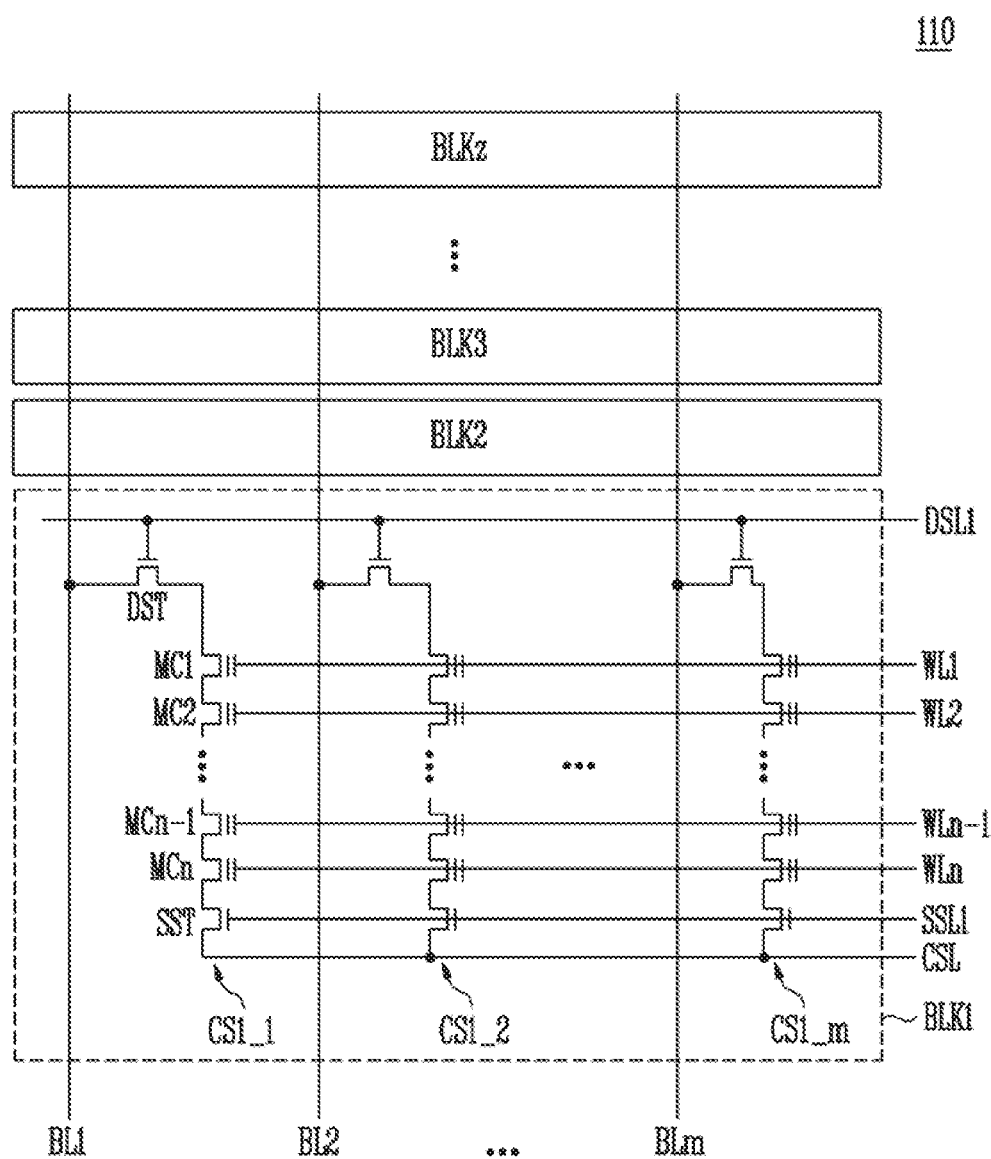
FIG. 3 is a diagram, illustrating a memory cell array of FIG. 2.

FIG. 3 is a diagram, illustrating the memory cell array of FIG. 2.

Referring to FIG. 3, the first to z-th memory blocks BLK1 to BLKz may be coupled in common to the first to m-th bit lines BL1 to BLm. In FIG. 3, for convenience of description, elements that are included in the first memory block BLK1, among the plurality of memory blocks BLK1 to BLKz, are illustrated, and illustration of elements that are included in each of the remaining memory blocks BLK2 to BLKz is omitted. It will be understood that each of the remaining memory blocks BLK2 to BLKz has the same configuration as the first memory block BLK1.

The memory block BLK1 may include a plurality of cell strings CS1_1 to CS1_m (where m is a positive integer). The first to m-th cell strings CS1_1 to CS1_m may be respectively coupled to the first to m-th bit lines BL1 to BLm. Each of the first to m-th cell strings CS1_1 to CS1_m may include a drain select transistor DST, a plurality of memory cells MC1 to MCn (where n is a positive integer) that are coupled in series, and a source select transistor SST.

A gate terminal of the drain select transistor DST that is included in each of the first to m-th cell strings CS1_1 to CS1_m may be coupled to a drain select line DSL1. Gate terminals of the first to n-th memory cells MC1 to MCn that are included in each of the first to m-th cell strings CS1_1 to CS1_m may be coupled to first to n-th word lines WL1 to WLn, respectively. A gate terminal of the source select transistor SST that is included in each of the first to m-th cell strings CS1_1 to CS1_m may be coupled to a source select line SSL1.

For convenience of description, the structure of each cell string will be described based on the first cell string CS1_1, among the plurality of cell strings CS1_1 to CS1_m. However, it will be understood that each of the remaining cell strings CS1_2 to CS1_m is configured in the same manner as the first cell string CS1_1.

A drain terminal of the drain select transistor DST that is included in the first cell string CS1_1 may be coupled to the first bit line BL1, A source terminal of the drain select transistor DST that is included in the first cell string CS1_1 may be coupled to a drain terminal of the first memory cell MC1 included in the first cell string CS1_1. The first to n-th memory cells MC1 to MCn may be coupled in series. A drain terminal of the source select transistor SST that is included in the first cell string CS1_1 may be coupled to a source terminal of the n-th memory cell MCn included in the first cell string CS1_1. A source terminal of the source select transistor SST that is included in the first cell string CS1_1 may be coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 may be included in the row lines RL of FIG. 2. The drain select line DSL1, the first to n-th word lines WL1 to WLn, and the source select line SSL1 may be controlled by the address decoder 121. The common source line CSL may be controlled by the control logic 130. The first to m-th bit lines BL1 to BLm may be controlled by the read and write circuit 123.

Figure 4:
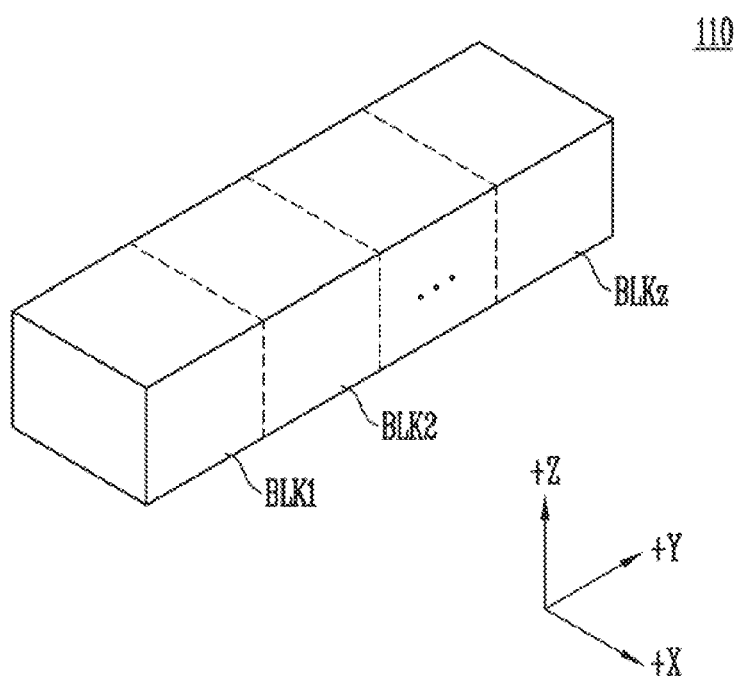
FIG. 4 is a diagram, illustrating an embodiment of the memory cell array of FIG. 2.

FIG. 4 is a diagram, illustrating an embodiment of the memory cell array of FIG. 2.

Referring to FIG. 4, the memory cell array 110 may include a plurality of memory blocks BLK1 to BLKz. Each memory block may have a three-dimensional (3D) structure. Each memory block may include a plurality of memory cells that are stacked on a substrate. Such memory cells may be arranged in a positive X (+X) direction, a positive Y (+Y) direction, and a positive Z (+Z) direction. The structure of each memory block will be described in detail below with reference to FIGS. 5 and 6.

Figure 5:
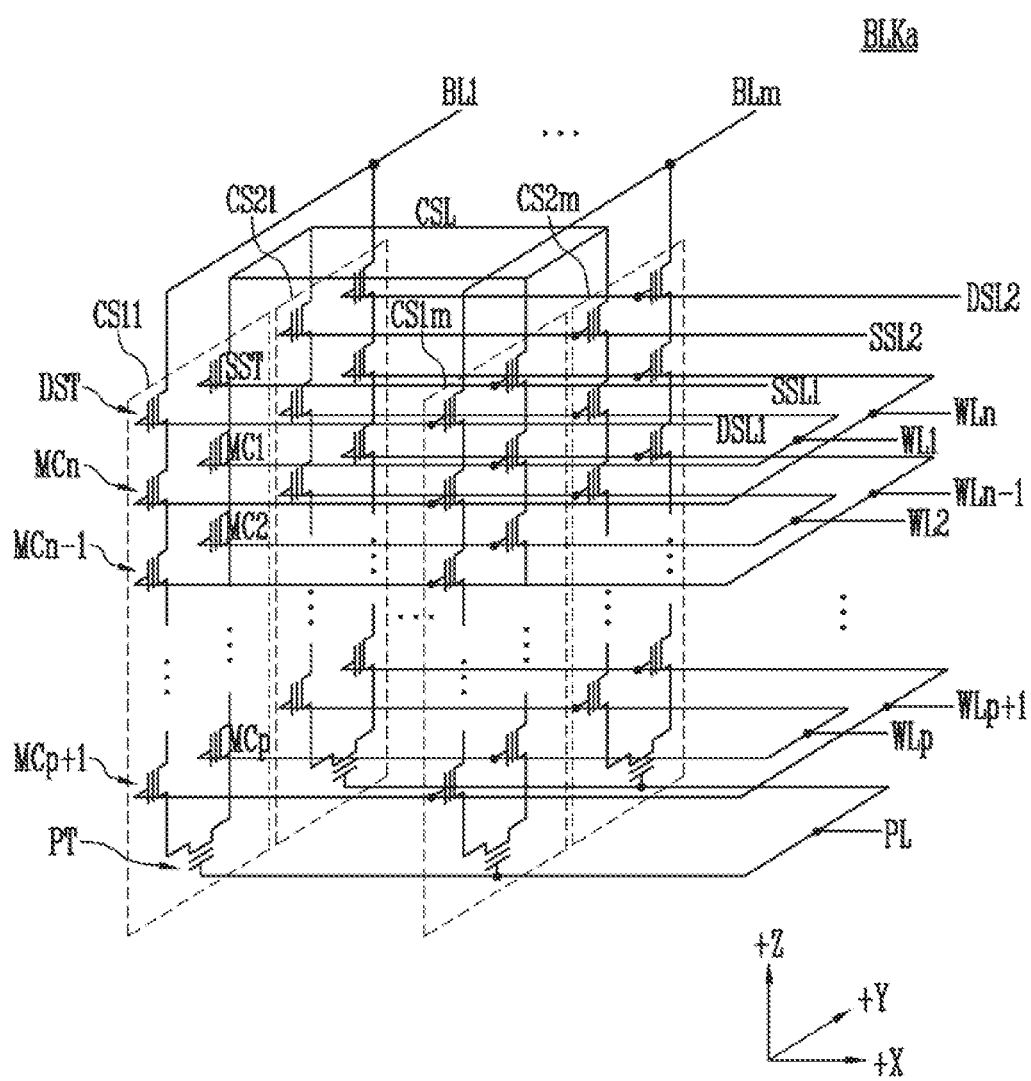
FIG. 5 is a circuit diagram, illustrating any one memory block BLKa of memory blocks BLK1 to BLKz of FIG. 4.

FIG. 5 is a circuit diagram, illustrating any one memory block BLKa of memory blocks BLK1 to BLKz of FIG. 4.

Referring to FIG. 5, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e. a positive (+) X direction). In FIG. 5 two cell strings are illustrated as being arranged in a column direction (i.e. a positive (+) Y direction). However, this illustration is made for convenience of description, and it will be understood that three or more cell strings may be arranged in the column direction.

In an embodiment, a single memory block may include a plurality of sub-blocks. A single sub-block may include cell strings arranged in a 'U' shape in a single column.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be coupled between the common source line CSL and memory cells MC1 to MCp.

In an embodiment, the source select transistors of cell strings that are arranged in the same row may be coupled to a source select line, extending in a row direction, and source select transistors of cell strings that are arranged in different rows may be coupled to different source select lines. In FIG. 5 source select transistors of cell strings CS11 to CS1m in a first row may be coupled to a first source select line SSL1. The source select transistors of cell strings CS21 to CS2m in a second row may be coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a direction opposite a positive (+) Z direction and may be coupled in series between the source select transistor SST and the pipe transistor PT. The p+1-th to n-th memory cells MCp+1 to MCn may be sequentially arranged in the +Z direction and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. The gates of the first to n-th memory cells MC1 to MCn of each cell string may be coupled to first to n-th word lines WL1 to WLn, respectively.

A gate of the pipe transistor PT of each cell string may be coupled to a pipeline PL.

The drain select transistor DST of each cell string may be coupled between the corresponding bit line and the memory cells MCp+1 to MCn. The cell strings in a row direction may be coupled to drain select lines that extend in a row direction. Drain select transistors of cell strings CS11 to CS1m in the first row may be coupled to a first drain select line DSL1, Drain select transistors of cell strings CS21 to CS2m in a second row may be coupled to a second drain select line DSL2.

Cell strings that are arranged in a column direction may be coupled to bit lines extending in a column direction. In FIG. 5 cell strings CS11 and CS21 in a first column may be coupled to a first bit line BL1. Cell strings CS1m and CS2m in an m-th column may be coupled to an m-th bit line BLm.

Memory cells that are coupled to the same word line in cell strings, arranged in the row direction, may form a single page. For example, memory cells that are coupled to the first word line WL1, among the cell strings CS11 to CS1m in the first row, may form a single page.

Memory cells that are coupled to the first word line WL1, among the cell strings CS21 to CS2m in the second row, may form an additional page. Cell strings that are arranged in the direction of a single row may be selected by selecting any one of the drain select lines DSL1 and DSL2. A single page may be selected from the selected cell strings by selecting any one of the word lines WL1 to WLn.

In an embodiment, instead of the first to m-th bit lines BL1 to BLm, even bit lines and odd bit lines may be provided. Further, even-numbered cell strings, among the cell strings CS11 to CS1m or CS21 to CS2m, arranged in the row direction, may be coupled to respective even bit lines. Odd-numbered cell strings, among the cell strings CS11 to CS1m or CS21 to CS2m, arranged in the row direction, may be coupled to respective odd bit lines.

In an embodiment, one or more of the first to n-th memory cells MC1 to MCn may be used as dummy memory cells. For example, one or more dummy memory cells may be provided to reduce an electric field between the source select transistor SST and the memory cells MC1 to MCp. Alternatively, one or more dummy memory cells may be provided to reduce the electric field between the drain select transistor DST and the memory cells MCp+1 to MCn. As more dummy memory cells are provided, the reliability of the operation of the memory block BLKa may be improved, whereas the size of the memory block BLKa may increase. As fewer memory cells are provided, the size of the memory block BLKa may decrease, whereas the reliability of the operation of the memory block BLKa may deteriorate.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells may control the voltages that are applied to the dummy word lines that are coupled to respective dummy memory cells, and thus, the dummy memory cells may have required threshold voltages.

Figure 6:
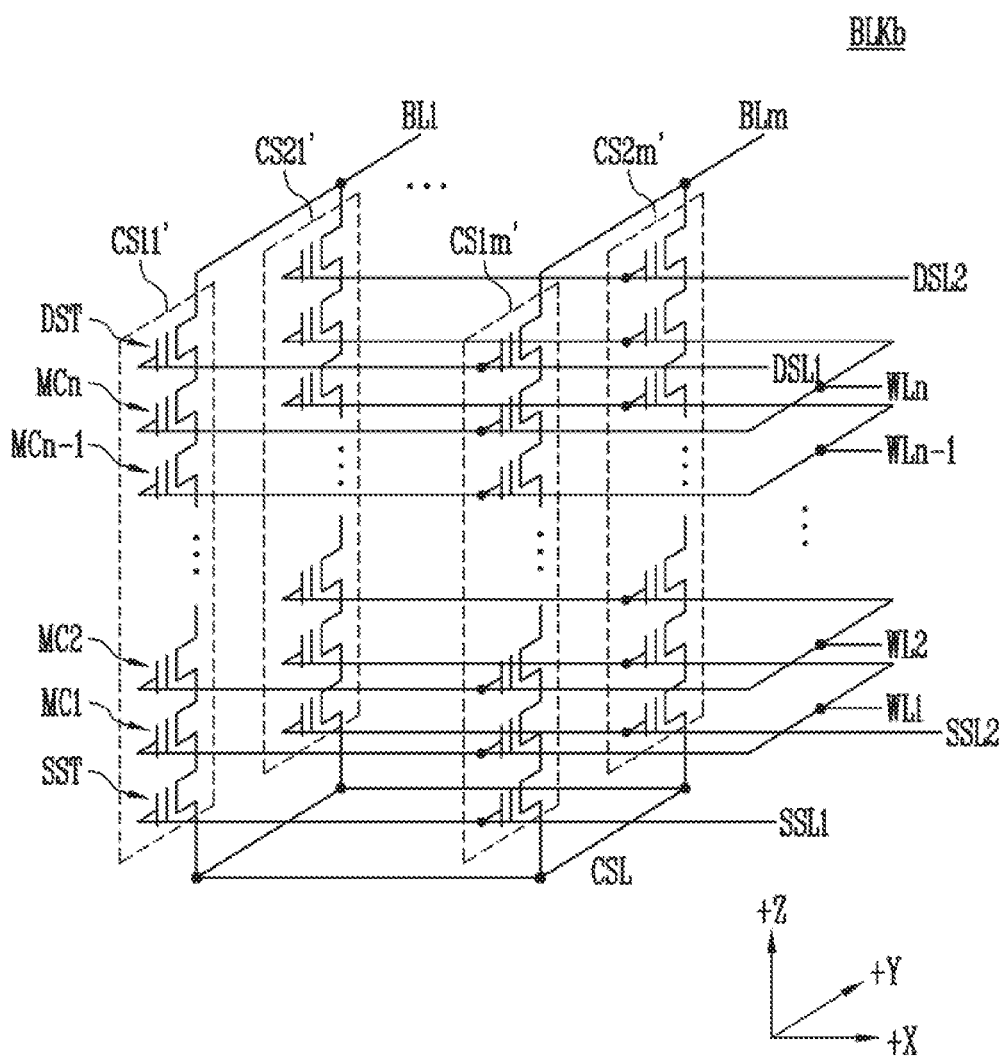
FIG. 6 is a circuit diagram, illustrating an example of any one memory block BLKb of the memory blocks BLK1 to BLKz of FIG. 4.

FIG. 6 is a circuit diagram, illustrating an example of any one memory block BLKb of the memory blocks BLK1 to BLKz of FIG. 4.

Referring to FIG. 6, the memory block BLKb may include a plurality of cell strings CS11' to CS1m' and CS21' to CS2m'. Each of the cell strings CS11' to CS1m' and CS21' to CS2m' may extend in a positive (+) Z direction. Each of the cell strings CS11' to CS1m' and CS21' to CS2m' may include at least one source select transistor SST, first to n-th memory cells MC1 to MCn, and at least one drain select transistor DST, which are stacked on a substrate (not illustrated) below the memory block BLKb.

In an embodiment, a single memory block may include a plurality of sub-blocks. A single sub-block may include cell strings that are arranged in an shape in a single column.

The source select transistor SST of each cell string may be coupled between a common source line CSL and memory cells MC1 to MCn. The source select transistors of cell strings that are arranged in the same row may be coupled to the same source select line. Source select transistors of cell strings CS11' to CS1m' that are arranged in a first row may be coupled to a first source select line SSL1. Source select transistors of cell strings CS21' to CS2m' that are arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string may be coupled in series between the source select transistor SST and the drain select transistor DST. The gates of the first to n-th memory cells MC1 to MCn may be coupled to first to n-th word lines WL1 to WLn, respectively.

The drain select transistor DST of each cell string may be coupled between the corresponding bit line and the memory cells MC1 to MCn. Drain select transistors of cell strings that are arranged in a row direction may be coupled to drain select lines extending in a row direction. The drain select transistors of the cell strings CS11' to CS1m' in the first row may be coupled to a first drain select line DSL1. The drain select transistors of the cell strings CS21' to CS2m' in the second row may be coupled to a second drain select line DSL2.

As a result, the memory block BLKb of FIG. 6, has an equivalent circuit that is similar to the memory block BLKa of FIG. 5 except that a pipe transistor PT is excluded from each cell string.

In an embodiment, instead of the first to m-th bit lines BL1 to BLm, even bit lines and odd bit lines may be provided. Further, even-numbered cell strings, among the cell strings CS11' to CS1m' or CS21' to CS2m', arranged in the row direction, may be coupled to respective even bit lines. Odd-numbered cell strings, among the cell strings CS11' to CS1m' or CS21' to CS2m', arranged in the row direction, may be coupled to respective odd bit lines.

In an embodiment, one or more of the first to n-th memory cells MC1 to MCn may be used as dummy memory cells. For example, the one or more dummy memory cells may be provided to reduce the electric field between the source select transistor SST and the memory cells MC1 to MCn. Alternatively, the one or more dummy memory cells may be provided to reduce the electric field between the drain select transistor DST and the memory cells MC1 to MCn. As the number of dummy memory cells that are provided increases, the reliability of operation of the memory block BLKb may be improved, whereas the size of the memory block BLKb may increase. As the number of dummy memory cells that are provided decreases, the size of the memory block BLKb may decrease, whereas the reliability of operation of the memory block BLKb may deteriorate.

In order to efficiently control the one or more dummy memory cells, respective dummy memory cells may have required threshold voltages. Before or after an erase operation on the memory block BLKb is performed, program operations may be performed on all or some of the dummy memory cells. When the erase operation is performed after the program operations have been performed, the dummy memory cells may have required threshold voltages by controlling voltages to be applied to dummy word lines that are coupled to respective dummy memory cells.

Figure 7:
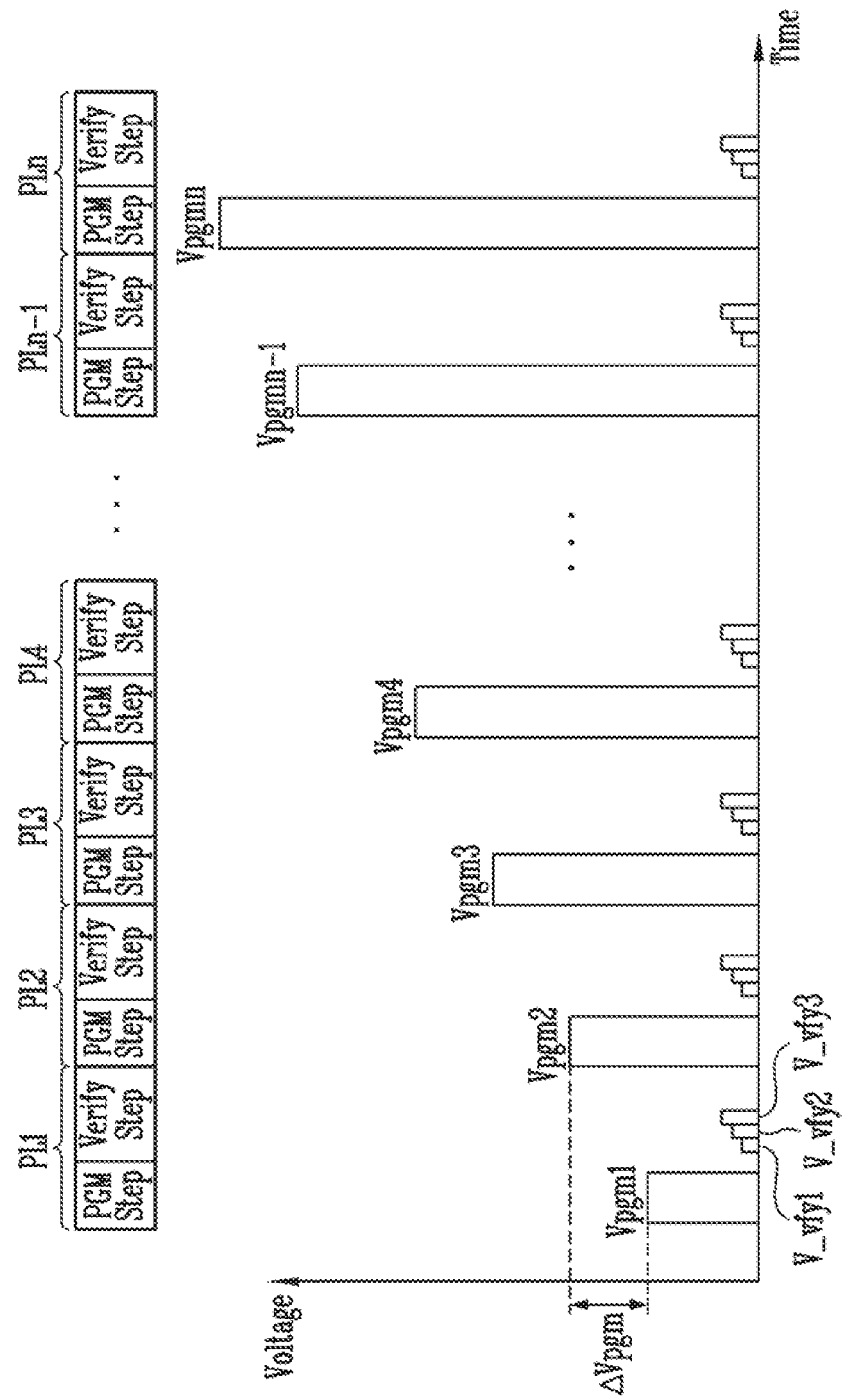
FIG. 7 is a diagram, illustrating a program operation of the memory device of FIG. 2.

FIG. 7 is a diagram, illustrating a program operation of the memory device of FIG. 2.

In FIG. 7, for convenience of description, a memory cell is assumed to be a multi-level cell (MLC) that stores 2-bit data. However, the scope of the present disclosure is not limited thereto, and the memory cell may be a triple-level cell (TLC) that stores 3-bit data or a quad-level cell (QLC) that stores 4-bit data. The number of data bits stored in each memory cell may be one or more.

The memory device may perform a program operation so that each of selected memory cells has a threshold voltage corresponding to any one of a plurality of program states P1, P2, and P3 by performing a plurality of program loops PL1 to PLn.

Each of the program loops PL1 to PLn may include a program voltage apply step (PGM step) that applies a program voltage to a selected word line that is coupled to the selected memory cells and a verify step that determines whether the memory cells have been programmed by applying verify voltages.

For example, when the first program loop PL1 is performed, a first program pulse Vpgm1 may be applied, and thereafter, first to third verify voltages V_vfy1 to V_vfy3 may be sequentially applied so as to verify the program states of the selected memory cells. Here, memory cells, the target program state of which is the first program state P1 may be verified by using the first verify voltage V_vfy1. Memory cells, the target program state of which is the second program state P2 may be verified by using the second verify voltage V_vfy2. And memory cells, the target program state of which is the third program state P3 may be verified by using the third verify voltage V_vfy3.

The memory cells that have passed verification (i.e., verify-passed) through respective verify voltages V_vfy1 to V_vfy3 may be determined to have the target program states and may then be program-inhibited in the second program loop PL2. In other words, a program-inhibit voltage may be applied to bit lines that are coupled to memory cells with passed verification from the second program loop PL2.

In order to program memory cells other than the program-inhibited memory cells in the second program loop PL2, a second program pulse Vpgm2 that is higher than the first program pulse Vpgm1 by a unit voltage (step voltage) ΔVpgm may be applied to a selected word line. Thereafter, a verify operation may be performed in the same way as the verify operation in the first program loop PL1, In an example, the term "verify-passed" may indicate that a memory cell is read as an off-cell through the corresponding verify voltage.

As described above, when the memory device programs multi-level cells (MLC) that store 2 bits, the memory device individually may verify the memory cells with respective program states as target program states by using the first to third verify voltages V_vfy1 to V_vfy3.

During the verify operation, a verify voltage may be applied to the selected word line that is a word line that is coupled to selected memory cells, and the page buffer of FIG. 2 may determine whether the selected memory cells have passed verification based on currents or voltages that flow through bit lines respectively coupled to the selected memory cells.

Figure 8:
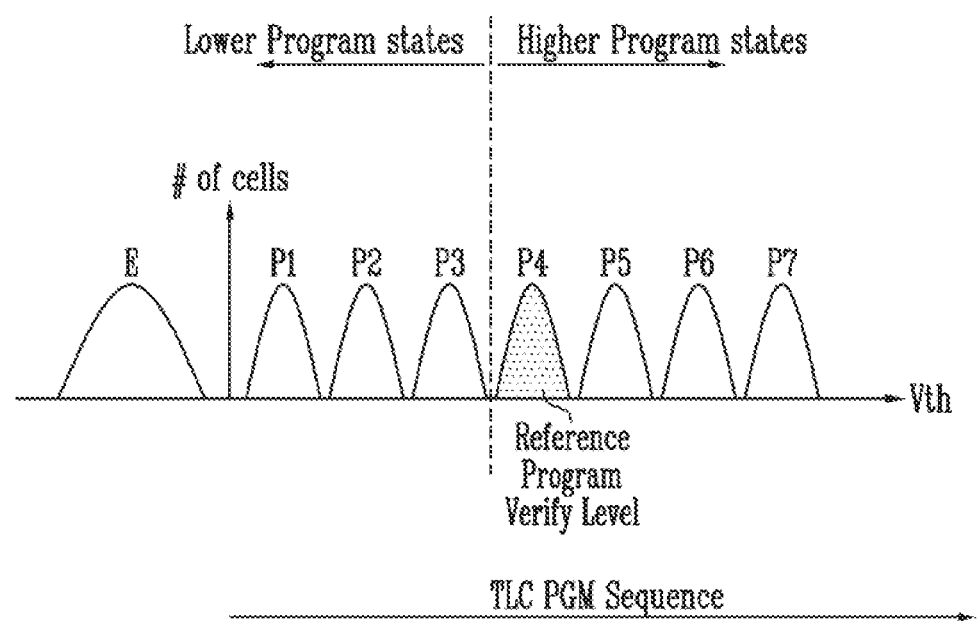
FIG. 8 is a diagram, explaining the degree of progress of a program operation, according to an embodiment.

FIG. 8 is a diagram, explaining the degree of progress of a program operation, according to an embodiment.

Referring to FIG. 8, a horizontal axis indicates the threshold voltages of memory cells, and a vertical axis indicates the number of memory cells.

In FIG. 8, the description is made on the assumption that memory cells are triple-level cells (TLC), each of which stores 3 bits. The number of data bits that are stored in one memory cell is not limited to the present embodiment.

Each of the memory cells may be programmed to any one of an erased state E and a plurality of program states P1 to P7. A program operation may be performed while a program verify level sequentially increases from the erased state E to the highest program state P7.

The program verify level may be the level of a program state in which a program verify operation is performed. For example, when a program verify operation is currently being performed on cells to be programmed to the first program state P1, the program verify level for the current program operation may be a first program verify level. When the program verify operation on the cells to be programmed to the first program state P1 has been completed, and a program verify operation is currently being performed on cells to be programmed to the second program state P2, the program verify level for the current program operation may be a second program verify level. Similarly, when a program verify operation is currently being performed on cells to be programmed to the seventh program state P7, the program verify level for the current program operation may be a seventh program verify level.

In an embodiment, the degree of progress of the program operation may be the program verify level. A reference degree of progress may be a reference program verify level. The reference program verify level may be a program verify level that is set to determine whether the degree of progress of the program operation is high or low. That is, based on the result of a comparison between the program verify level and the reference program verify level, the degree to which the program operation has progressed may be determined. In various embodiments, the reference program verify level may be changed based on a request from a memory controller 200.

The reference program verify level may be a reference based on which a lower program state and a higher program state are distinguished from each other. In FIG. 8, the reference program verify level may be a fourth program verify level. The reference program verify level is not limited to the present embodiment.

For example, when the program verify level is lower than the reference program verify level, the program verify level may be a program verify level that corresponds to the lower program states P1 to P3. For example, when the program verify level is equal to or higher than the reference program verify level, the program verify level may be a program verify level that corresponds to the higher program states P4 to P7.

Figure 9:
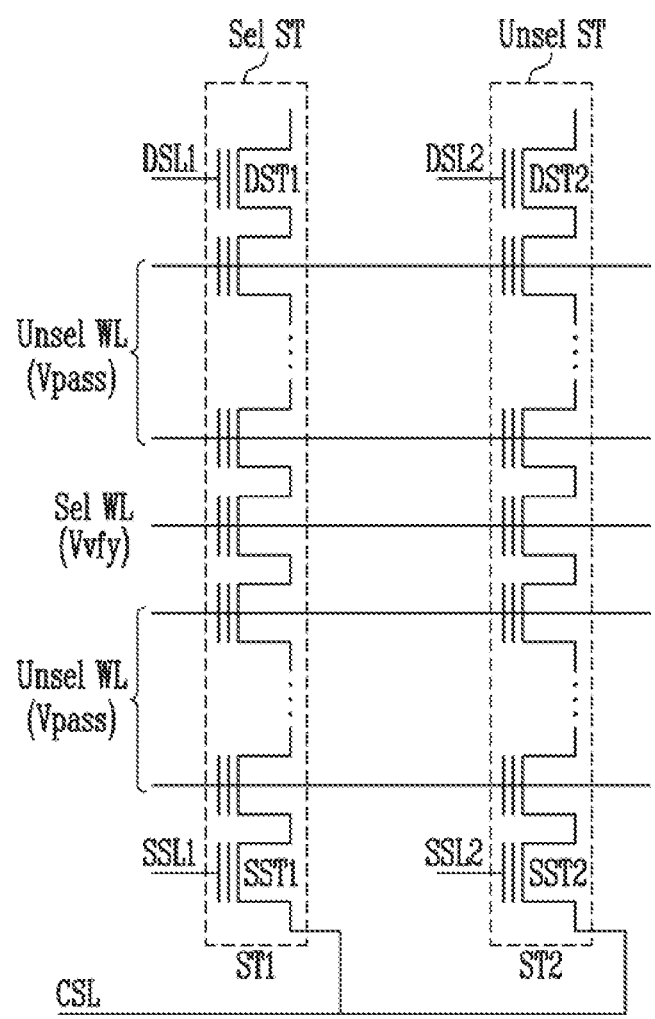
FIG. 9 is a circuit diagram, of cell strings according to an embodiment.

FIG. 9 is a circuit diagram of cell strings according to an embodiment.

Referring to FIG. 9, a memory device may include first and second cell strings ST1 and ST2. The number of cell strings that are included in the memory device is not limited by the present embodiment.

The first cell string ST1 may be a selected cell string Sel ST on which a program operation and a program verify operation are performed. The second cell string ST2 may be an unselected cell string Unsel ST.

A drain select transistor DST1 in the first cell string ST1 may be coupled to a first drain select line DSL1. A plurality of memory cells in the first cell string ST1 may be coupled to a plurality of word lines, respectively. A source select transistor SST1 of the first cell string ST1 may be coupled to a first source select line SSL1.

A drain select transistor DST2 in the second cell string ST2 may be coupled to a second drain select line DSL2. A plurality of memory cells in the second cell string ST2 may be coupled to the plurality of word lines, respectively. A source select transistor SST2 of the second cell string ST2 may be coupled to a second source select line SSL2.

The source select transistor SST1 of the first cell string ST1 and the source select transistor SST2 of the second cell string ST2 may be coupled to a common source line CSL.

While a program verify operation is performed, a program verify voltage Vvfy may be applied to a word line Sel WL selected from among the plurality of word lines. A program pass voltage Vpass may be applied to unselected word lines Unsel WL among the plurality of word lines. A ground voltage may be applied to the common source line CSL.

Figure 10:
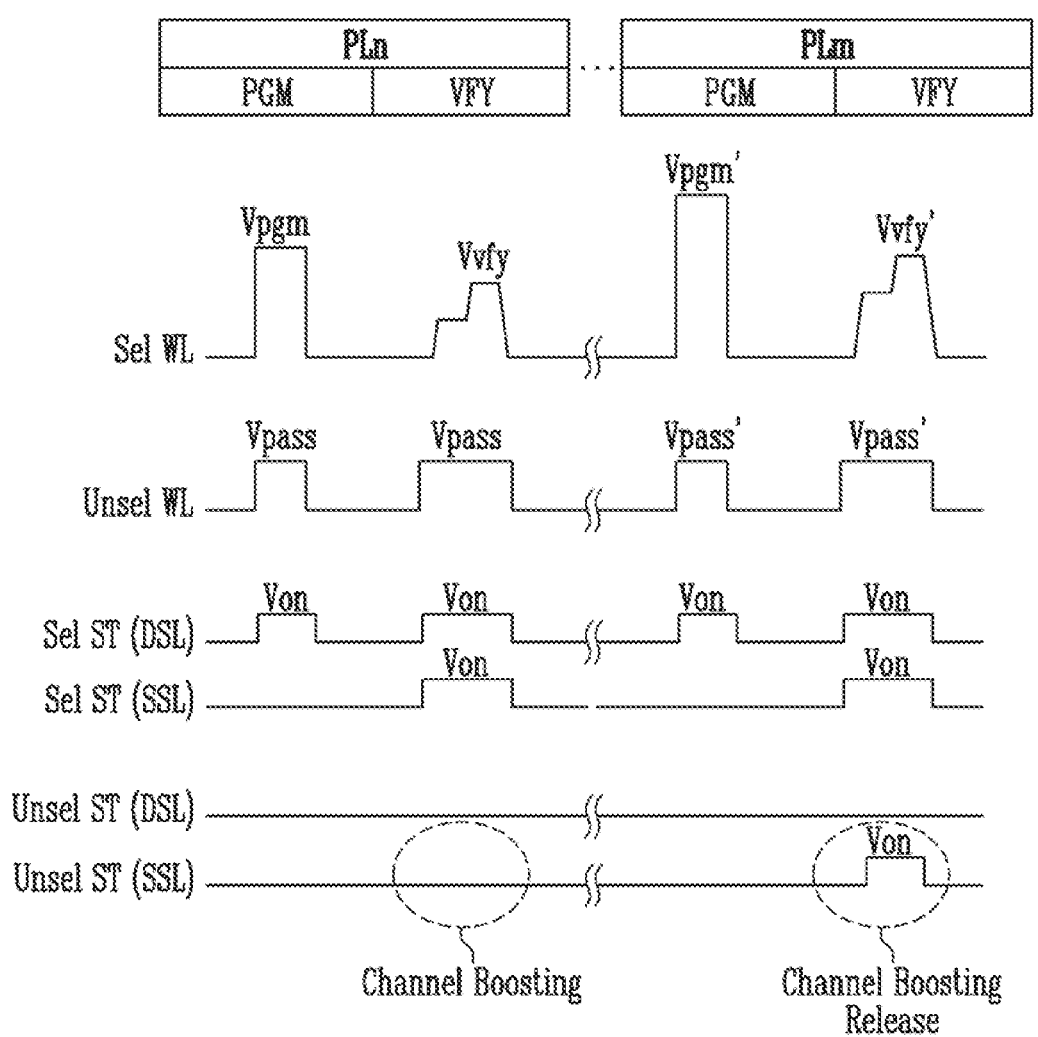
FIG. 10 is a diagram, explaining the boosting control for the channel voltage of an unselected cell string during a program verify operation that is performed on the cell strings of FIG. 9.

FIG. 10 is a diagram, explaining the boosting control for the channel voltage of an unselected cell string during a program verify operation that is performed on the cell strings of FIG. 9.

Referring to FIG. 10, PLk (where k is a natural number of 2 or more) may be a reference program loop. A reference program loop count k may be a program loop count that is set to determine whether the degree of progress of a program operation is high or low. PLn (where n is a natural number less than k) may be a lower program loop. PLm (where m is a natural number equal to or greater than k) may be a higher program loop.

During a program verify operation in the lower program loop, a program verify voltage Vvfy may be applied to a selected word line. A program pass voltage Vpass may be applied to unselected word lines. A turn-on voltage Von may be applied to the drain select line that is coupled to the drain select transistor of the selected cell string. The turn-on voltage Von may be applied to the source select line that is coupled to the source select transistor of the selected cell string. A ground voltage may be applied to the drain select line that is coupled to the drain select transistor of the unselected cell string. The ground voltage may be applied to the source select line that is coupled to the source select transistor of the unselected cell string. In a state in which both the drain select transistor and the source select transistor of the unselected cell string are turned off, the channel voltage of the unselected cell string may be boosted due to the program pass voltage Vpass applied to the unselected word lines. When the channel voltage of the unselected cell string is boosted, the difference between the voltages of the word lines and the channel of the unselected cell string may be reduced, and a capacitance component between the word lines and the channel may be reduced. When the capacitance component is reduced, the time required to drive the unselected cell string may decrease, and thus, the total time required for the entire program verify operation may be shortened.

During a program verify operation in the higher program loop, a program verify voltage Vvfy' may be applied to a selected word line. The program pass voltage Vpass may be applied to unselected word lines. A turn-on voltage Von may be applied to a drain select line that is coupled to a drain select transistor of a selected cell string. The turn-on voltage Von may be applied to a source select line that is coupled to a source select transistor of the selected cell string. A ground voltage may be applied to a drain select line that is coupled to a drain select transistor of an unselected cell string. The ground voltage may be applied to a source select line that is coupled to a source select transistor of the unselected cell string, and then the turn-on voltage Von may be applied thereto.

In a state in which both the drain select transistor and the source select transistor of the unselected cell string are turned off, the channel voltage of the unselected cell string may be boosted due to a program pass voltage Vpass' applied to the unselected word lines. In this case, since the pass voltage Vpass' of the higher program loop is higher than the pass voltage Vpass of the lower program loop, the magnitude of the channel voltage boosted in the higher program loop may be higher than that of the channel voltage boosted in the lower program loop. Therefore, due to the excessively boosted channel voltage, memory cells to which the program verify voltage Vvfy' is applied may be slightly erased. Therefore, by turning on the drain select transistor after the channel voltage of the unselected cell string has been boosted by turning off the drain select transistor, the excessively boosted channel voltage may be decreased to a suitable level, and a phenomenon in which memory cells are slightly erased may be improved.

Figure 11:
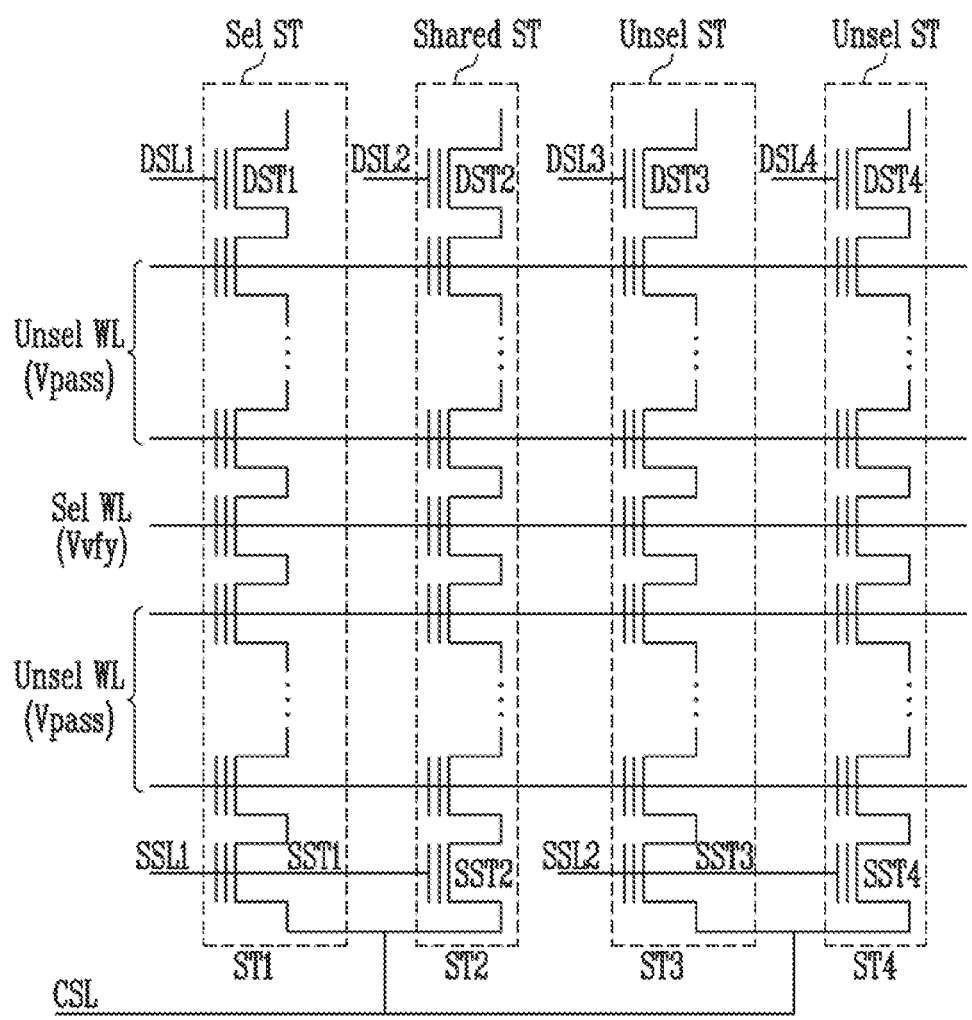
FIG. 11 is a circuit diagram of cell strings according to an embodiment.

FIG. 11 is a circuit diagram of cell strings according to an embodiment.

Referring to FIG. 11, a memory device may include first to fourth cell strings ST1 to ST4. The number of cell strings included in the memory device is not limited to the present embodiment.

The first cell string ST1 may be a selected cell string Sel ST on which a program operation and a program verify operation are performed. The second cell string ST2 may be a shared cell string Shared ST. The shared cell string may be a cell string that shares a source select line with the selected cell string. The third and fourth cell strings ST3 and ST4 may be unselected cell strings Unsel ST.

A drain select transistor DST1 of the first cell string ST1 may be coupled to a first drain select line DSL1. A plurality of memory cells of the first cell string ST1 may be coupled to a plurality of word lines, respectively. A source select transistor SST1 of the first cell string ST1 may be coupled to a first source select line SSL1.

A drain select transistor DST2 of the second cell string ST2 may be coupled to a second drain select line DSL2. A plurality of memory cells of the second cell string ST2 may be coupled to the plurality of word lines, respectively. A source select transistor SST2 of the second cell string ST2 may be coupled to the first source select line SSL1.

A drain select transistor DST3 of the third cell string ST3 may be coupled to a third drain select line DSL3. A plurality of memory cells of the third cell string ST3 may be coupled to the plurality of word lines, respectively. A source select transistor SST3 of the third cell string ST3 may be coupled to a second source select line SSL2.

A drain select transistor DST4 of the fourth cell string ST4 may be coupled to a fourth drain select line DSL4. A plurality of memory cells of the fourth cell string ST4 may be coupled to the plurality of word lines, respectively. A source select transistor SST4 of the fourth cell string ST4 may be coupled to the second source select line SSL2.

Respective source select transistors SST1 to SST4 of the first to fourth cell strings ST1 to ST4 may be coupled to a common source line CSL.

While a program verify operation is performed, a program verify voltage Vvfy may be applied to a word line selected from among the plurality of word lines. A program pass voltage Vpass may be applied to unselected word lines, among the plurality of word lines. A ground voltage may be applied to the common source line CSL.

Figure 12:
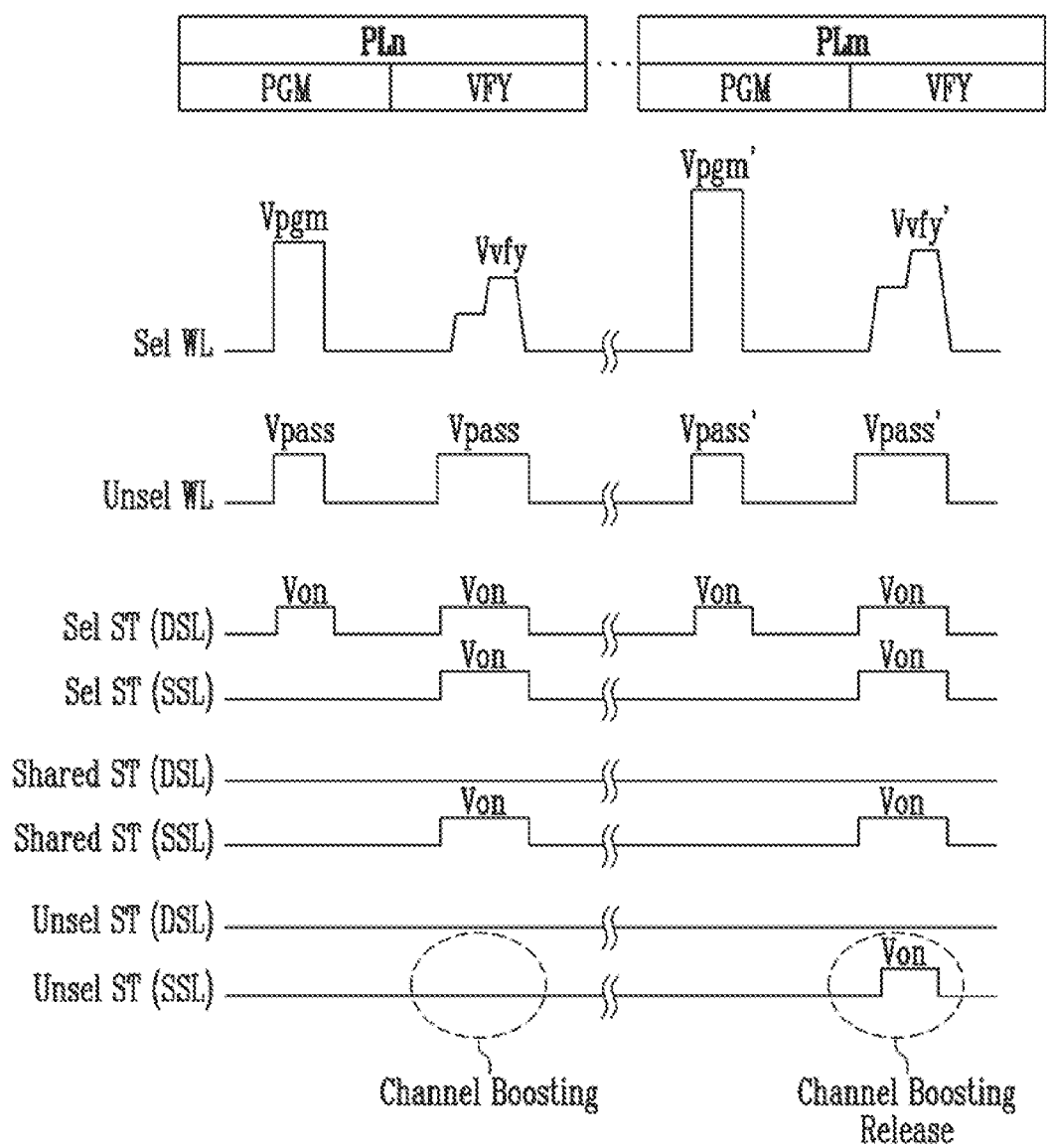
FIG. 12 is a diagram, explaining the boosting control for the channel voltage of an unselected cell string during a program verify operation that is performed on the cell strings of FIG. 11.

FIG. 12 is a diagram, illustrating the boosting control for the channel voltage of an unselected cell string during a program verify operation that is performed on the cell strings of FIG. 11.

Referring to FIG. 12, the operations of a selected cell string and an unselected cell string may be described in a way similar to that of FIG. 10.

During a program verify operation in all program loops, a ground voltage may be applied to the drain select line that is coupled to the drain select transistor of the shared cell string. A turn-on voltage Von may be applied to the source select line that is coupled to the source select transistor of the shared cell string. Since the shared cell string is a cell string on which a program verify operation is not performed, the drain select transistor of the shared cell string may be turned off during the program verify operation, similarly to an unselected cell string. However, since the shared cell string shares the source select line with the selected cell string, the source select transistor of the shared cell string may be turned on during the program verify operation.

FIG. 13A is a timing diagram, illustrating a voltage that is applied to a source select line that is coupled to a source select transistor of an unselected cell string during a program verify operation, according to an embodiment.

Referring to FIG. 13A, a program verify operation may be performed during a period from ta1 to ta2.

During the period from ta1 to ta2, a program verify voltage Vvfy may be applied to a selected word line.

During the period from ta1 to ta2, a first turn-on voltage Von1 may be applied to a source select line that is coupled to a source select transistor of a selected cell string. The first turn-on voltage Von1 may be a voltage that fully turns on the source select transistor.

During the period from ta1 to ta2, the first turn-on voltage Von1 may be applied to a source select line that is coupled to a source select transistor of an unselected cell string.

A period p1 during which the first turn-on voltage Von1 is applied to the source select line that is coupled to the source select transistor of the unselected cell string may be identical to a period p1 during which the first turn-on voltage Von1 is applied to the source select line that is coupled to the source select transistor of the selected cell string.

Figure 13B:
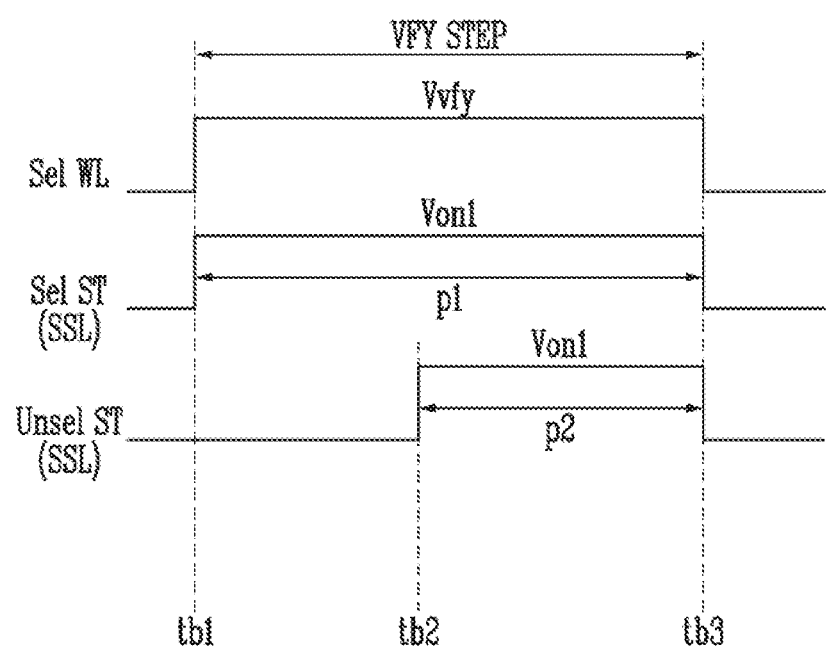
FIG. 13B is a timing diagram, illustrating a voltage applied to a source select line that is coupled to a source select transistor of an unselected cell string during a program verify operation, according to an embodiment.

FIG. 13B is a timing diagram, illustrating a voltage that is applied to a source select line that is coupled to a source select transistor of an unselected cell string during a program verify operation, according to an embodiment.

Referring to FIG. 13B, a program verify operation may be performed during a period from tb1 to tb3.

During the period from tb1 to tb3, a program verify voltage Vvfy may be applied to a selected word line.

During the period from tb1 to tb3, a first turn-on voltage Von1 may be applied to a source select line that is coupled to a source select transistor of a selected cell string. The first turn-on voltage Von1 may be a voltage that fully turns on the source select transistor.

During a period from tb1 to tb2, a ground voltage may be applied to a source select line that is coupled to a source select transistor of an unselected cell string. During a period from tb2 to tb3, the first turn-on voltage Von1 may be applied to the source select line that is coupled to the source select transistor of the unselected cell string. A time point at which the first turn-on voltage Von1 is applied to the source select line that is coupled to the source select transistor of the unselected cell string is not limited to the present embodiment.

A period p2 during which the first turn-on voltage Von1 is applied to the source select line that is coupled to the source select transistor of the unselected cell string may be shorter than a period p1 during which the first turn-on voltage Von1 is applied to the source select line that is coupled to the source select transistor of the selected cell string.

FIG. 13C is a timing diagram, illustrating a voltage that is applied to a source select line that is coupled to a source select transistor of an unselected cell string during a program verify operation, according to an embodiment.

Referring to FIG. 13C, a program verify operation may be performed during a period from tc1 to tc2.

During the period from tc1 to tc2, a program verify voltage Vvfy may be applied to a selected word line.

During the period from tc1 to tc2, a first turn-on voltage Von1 may be applied to a source select line that is coupled to a source select transistor of a selected cell string. The first turn-on voltage Von1 may be a voltage that fully turns on the source select transistor.

During the period from tc1 to tc2, a second turn-on voltage Von2 may be applied to a source select line that is coupled to a source select transistor of an unselected cell string. The second turn-on voltage Von2 may be a voltage that slightly turns on the source select transistor. The second turn-on voltage Von2 may be lower than the first turn-on voltage Von1.

A period p1 during which the second turn-on voltage Von2 is applied to the source select line that is coupled to the source select transistor of the unselected cell string may be identical to a period p1 during which the first turn-on voltage Von1 is applied to the source select line that is coupled to the source select transistor of the selected cell string.

Figure 13D:
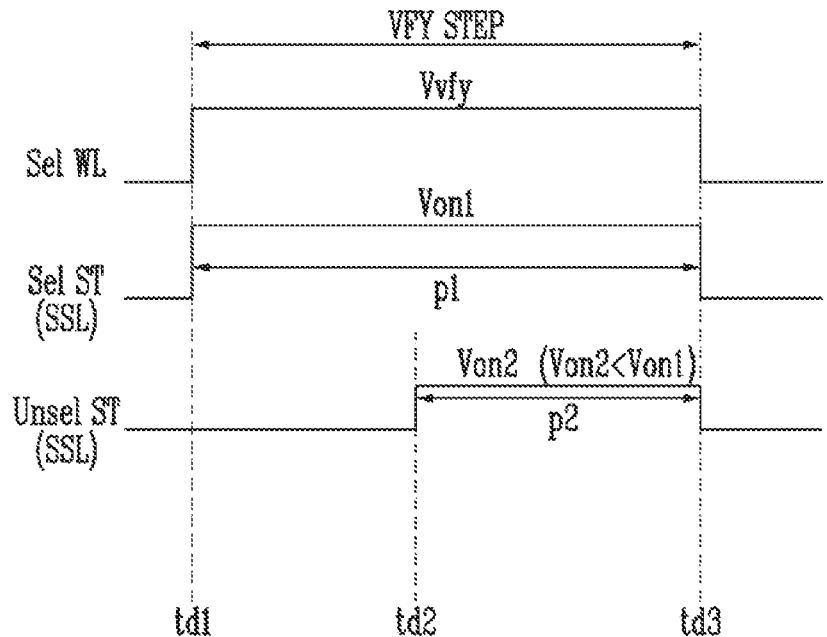
FIG. 13D is a timing diagram, illustrating a voltage applied to a source select line that is coupled to a source select transistor of an unselected cell string during a program verify operation, according to an embodiment.

FIG. 13D is a timing diagram, illustrating a voltage that is applied to a source select line that is coupled to a source select transistor of an unselected cell string during a program verify operation, according to an embodiment.

Referring to FIG. 13D, during a period from td1 to td3, a program verify voltage Vvfy may be applied to a selected word line.

During the period from td1 to td3, a first turn-on voltage Von1 may be applied to a source select line that is coupled to a source select transistor of a selected cell string. The first turn-on voltage Von1 may be a voltage that fully turns on the source select transistor.

During a period from td1 to td2, a ground voltage may be applied to a source select line that is coupled to a source select transistor of an unselected cell string. During a period from td2 to td3, a second turn-on voltage Von2 may be applied to the source select line that is coupled to the source select transistor of the unselected cell string. The second turn-on voltage Von2 may be a voltage that slightly turns on the source select transistor. The second turn-on voltage Von2 may be lower than the first turn-on voltage Von1. A time point at which the second turn-on voltage Von2 is applied to the source select line that is coupled to the source select transistor of the unselected cell string is not limited to the present embodiment.

A period p2 during which the second turn-on voltage Von2 is applied to the source select line that is coupled to the source select transistor of the unselected cell string may be shorter than a period p1 during which the first turn-on voltage Von1 is applied to the source select line that is coupled to the source select transistor of the selected cell string.

Figure 14:
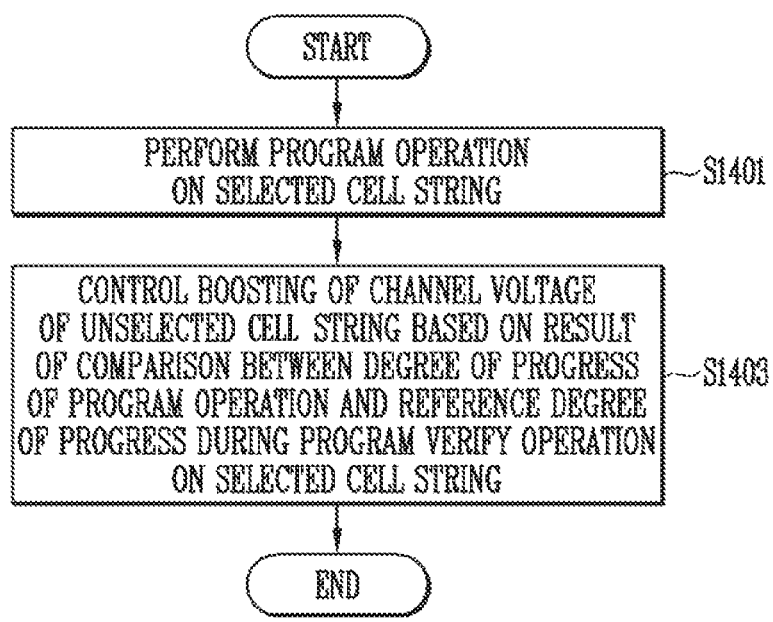
FIG. 14 is a flowchart, illustrating the operation of a memory device, according to an embodiment of the present disclosure.

FIG. 14 is a flowchart, illustrating the operation of a memory device, according to an embodiment of the present disclosure.

Referring to FIG. 14, at step S1401, a memory device may perform a program operation on a selected cell string.

At step S1403, the memory device may control the boosting of a channel voltage of an unselected cell string based on the result of a comparison between the degree of progress of the program operation and a reference degree of progress during a program verify operation that is performed on the selected cell string.

In an embodiment, the memory device may boost the channel voltage of the unselected cell string when the degree of progress of the program operation is lower than the reference degree of progress. When the degree of progress of the program operation is equal to or higher than the reference degree of progress, the memory device may boost the channel voltage of the unselected cell string, and may thereafter mitigate the boosted channel voltage to a suitable level.

In an embodiment, the degree of progress of the program operation may be a program verify level for the program operation that is currently being performed, and the reference degree of progress may be a reference program verify level. In other embodiments, the degree of progress of the program operation may be a program loop count for the program operation that is currently being performed, and the reference degree of progress may be a reference program loop count.

Figure 15:
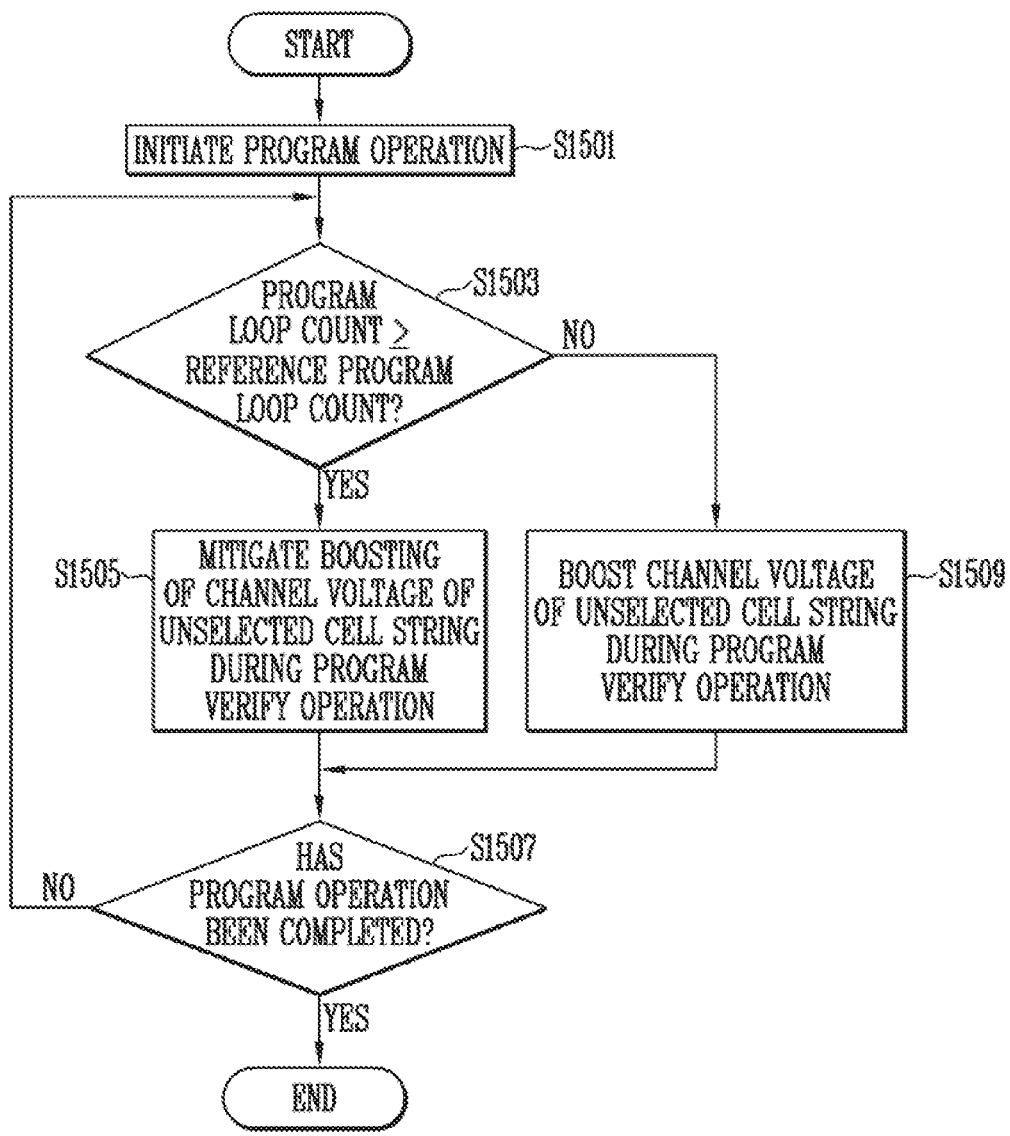
FIG. 15 is a flowchart, illustrating the embodiment of FIG. 14.

FIG. 15 is a flowchart, illustrating the embodiment of FIG. 14.

Referring to FIG. 15, at step S1501, a memory device may initiate a program operation on a selected cell string.

At step S1503, the memory device may determine whether a program loop count for the program operation is equal to or greater than a reference program loop count. When it is determined that the program loop count is equal to or greater than the reference program loop count, the process proceeds to step S1505, whereas when it is determined that the program loop count is less than the reference program loop count, the process proceeds to step S1509.

At step S1505, the memory device may mitigate the boosting of the channel voltage of an unselected cell string during a program verify operation performed on the selected cell string. For example, after the channel voltage of the unselected cell string has been boosted during the program verify operation, the memory device may mitigate the boosted channel voltage to a suitable level. As a result, a phenomenon in which memory cells to which a program verify voltage is applied, among memory cells in the unselected cell string, are slightly erased due to an excessively boosted channel voltage may be improved.

At step S1507, the memory device may determine whether the program operation on the selected cell string has been completed. When it is determined that the program operation has been completed, the process is terminated, whereas when it is determined that the program operation has not been completed, the process returns to step S1503.

At step S1509, the memory device may boost the channel voltage of the unselected cell string during the program verify operation performed on the selected cell string. As a result, the difference between the voltages of a word line that is coupled to the unselected cell string and a channel of the unselected cell string may be reduced, and thus a capacitance between the word line and the channel may be reduced. When the capacitance of the unselected cell string is reduced, the time required to drive the unselected cell string may be decreased, and thus the total time required for the entire program verify operation may be shortened.

Figure 16:
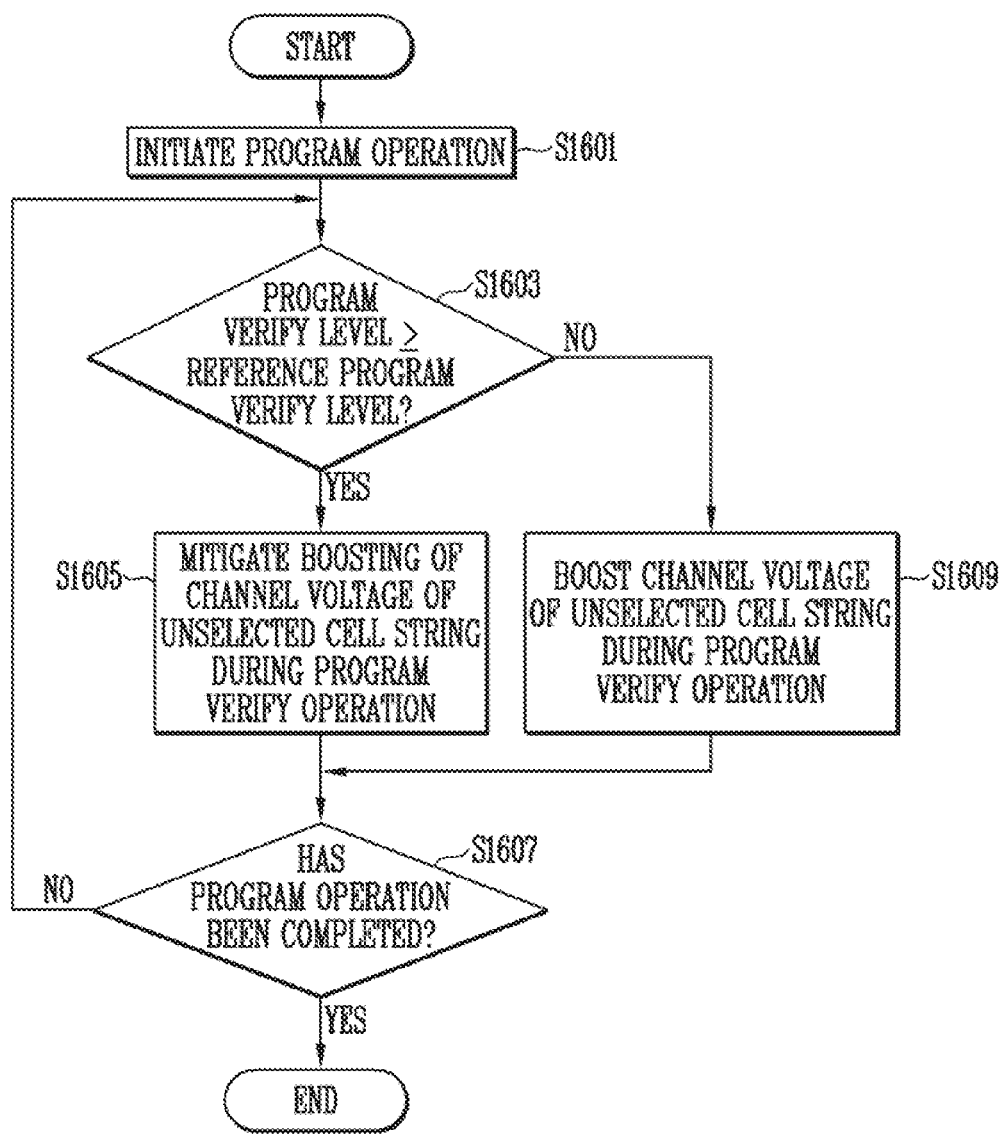
FIG. 16 is a flowchart, illustrating the embodiment of FIG. 14.

FIG. 16 is a flowchart, illustrating the embodiment of FIG. 14.

Referring to FIG. 16, at step S1601, a memory device may initiate a program operation on a selected cell string.

At step S1603, the memory device may determine whether a program verify level for the program operation is equal to or higher than a reference program verify level. When it is determined that the program verify level is equal to or higher than the reference program verify level, the process proceeds to step S1605, whereas when it is determined that program verify level is lower than the reference program verify level, the process proceeds to step S1609.

At step S1605, the memory device may mitigate the boosting of the channel voltage of an unselected cell string during a program verify operation performed on the selected cell string. For example, after the channel voltage of the unselected cell string has been boosted during the program verify operation, the memory device may mitigate the boosted channel voltage to a suitable level. As a result, a phenomenon in which memory cells to which a program verify voltage is applied, among memory cells in the unselected cell string, are slightly erased due to an excessively boosted channel voltage may be improved.

At step S1607, the memory device may determine whether the program operation on the selected cell string has been completed. When it is determined that the program operation has been completed, the process is terminated, whereas when it is determined that the program operation has not been completed, the process returns to step S1603.

At step S1609, the memory device may boost the channel voltage of the unselected cell string during the program verify operation performed on the selected cell string. As a result, the difference between the voltages of a word line that is coupled to the unselected cell string and a channel of the unselected cell string may be reduced, and thus a capacitance between the word line and the channel may be reduced. When the capacitance of the unselected cell string is reduced, the time required to drive the unselected cell string may be decreased, and thus the total time required for the entire program verify operation may be shortened.

In accordance with the present disclosure, a memory device with improved program verify operation performance and a method of operating the memory device is provided.

What is claimed is:

1. A memory device, comprising:
   a plurality of cell strings, each cell string including a drain select transistor, a source select transistor, and a plurality of memory cells coupled in series between the drain select transistor and the source select transistor;
   a peripheral circuit configured to perform a program operation and a program verify operation on a cell string that is selected from among the plurality of cell strings;
   a program progress information storage configured to store a degree of progress of the program operation;
   a reference progress information storage configured to store a reference degree of progress; and
   a program operation controller configured to control the peripheral circuit to boost a channel voltage of at least one unselected cell string, among the plurality of cell strings, based on a comparison of the degree of progress of the program operation and the reference degree of progress during the program verify operation.

2. The memory device according to claim 1, wherein:
   the degree of progress of the program operation is based on a program loop count for the program operation, and
   the reference degree of progress is a reference program loop count.

3. The memory device according to claim 1, wherein:
   the degree of progress of the program operation is based on a program verify level for the program operation, and
   the reference degree of progress is a reference program verify level.

4. The memory device according to claim 1, wherein:
   respective source select transistors that are included in the plurality of cell strings are coupled to a common source line, and
   a ground voltage is applied to the common source line during the program verify operation.

5. The memory device according to claim 1, wherein, during the program verify operation, when the degree of progress of the program operation is lower than the reference degree of progress, the program operation controller controls the peripheral circuit to apply a first turn-on voltage to a first source select line, coupled to a source select transistor that is included in the selected cell string, and apply a ground voltage to a second source select line, coupled to a source select transistor that is included in the at least one unselected cell string.

6. The memory device according to claim 1, wherein, during the program verify operation, when the degree of progress of the program operation is equal to or higher than the reference degree of progress, the program operation controller controls the peripheral circuit to apply a first turn-on voltage to a first source select line, coupled to a source select transistor that is included in the selected cell string, and apply a second turn-on voltage to a second source select line, coupled to a source select transistor that is included in the at least one unselected cell string.

7. The memory device according to claim 6, wherein the second turn-on voltage is lower than or equal to the first turn-on voltage.

8. The memory device according to claim 6, wherein a period in which the second turn-on voltage is applied to the second source select line is shorter than or equal to a period in which the first turn-on voltage is applied to the first source select line.

9. A memory device, comprising:
   first to fourth cell strings, each cell string including a drain select transistor, a source select transistor, and a plurality of memory cells coupled in series between the drain select transistor and the source select transistor;
   a peripheral circuit configured to perform a program operation and a program verify operation on memory cells in the first cell string;
   a program progress information storage configured to store a degree of progress of the program operation;
   a reference progress information storage configured to store a reference degree of progress;
   and
   a program operation controller configured to control the peripheral circuit to boost channel voltages of the third and fourth cell strings based on a comparison of the degree of progress of the program operation and the reference degree of progress during the program verify operation,
   wherein respective source select transistors included in the first and second cell strings are coupled to a first source select line, and
   wherein respective source select transistors included in the third and fourth cell strings are coupled to a second source select line.

10. The memory device according to claim 9, wherein:
    the degree of progress of the program operation is based on a program loop count for the program operation, and
    the reference degree of progress is a reference program loop count.

11. The memory device according to claim 9, wherein:
    the degree of progress of the program operation is based on a program verify level for the program operation, and
    the reference degree of progress is a reference program verify level.

12. The memory device according to claim 9, wherein:
    respective source select transistors that are included in the first to fourth cell strings are coupled to a common source line, and
    a ground voltage is applied to the common source line during the program verify operation.

13. The memory device according to claim 9, wherein, during the program verify operation, when the degree of progress of the program operation is lower than the reference degree of progress, the program operation controller controls the peripheral circuit to apply a first turn-on voltage to the first source select line and a ground voltage to the second source select line.

14. The memory device according to claim 9, wherein, during the program verify operation, when the degree of progress of the program operation is equal to or higher than the reference degree of progress, the program operation controller controls the peripheral circuit to apply a first turn-on voltage to the first source select line and a second turn-on voltage to the second source select line.

15. The memory device according to claim 14, wherein a period in which the second turn-on voltage is applied to the second source select line is shorter than or equal to a period in which the first turn-on voltage is applied to the first source select line.

16. A method of operating a memory device including a plurality of cell strings, each cell string including a drain select transistor, a source select transistor, and a plurality of memory cells coupled in series between the drain select transistor and the source select transistor, the method comprising:
performing a program operation on a cell string selected from among the plurality of cell strings; and
controlling a channel voltage boost of at least one unselected cell string, among the plurality of cell strings, based on a comparison of a degree of progress of the program operation stored in a program progress information storage and a reference degree of progress stored in a reference progress information storage during a program verify operation performed on the selected cell string.

17. The method according to claim 16, wherein the controlling of the channel voltage boost involves, when the degree of progress of the program operation is lower than the reference degree of progress, applying a first turn-on voltage to a first source select line, coupled to a source select transistor that is included in the selected cell string, and applying a ground voltage to a second source select line, coupled to a source select transistor included in the at least one unselected cell string.

18. The method according to claim 16, wherein the controlling of the channel voltage boost involves, when the degree of progress of the program operation is equal to or higher than the reference degree of progress, applying a first turn-on voltage to a first source select line, coupled to a source select transistor that is included in the selected cell string, and applying a second turn-on voltage to a second source select line that is coupled to a source select transistor included in the at least one unselected cell string, wherein the second turn-on voltage is lower than or equal to the first turn-on voltage.

19. The method according to claim 18, wherein a period in which the second turn-on voltage is applied to the second source select line is shorter than or equal to a period in which the first turn-on voltage is applied to the first source select line.

20. The method according to claim 16, wherein a result of the comparison of the degree of progress of the program operation and the reference degree of progress is determined based on a result of a comparison of a program verify level for the program operation and a reference program verify level, or based on a result of a comparison of a program loop count for the program operation and a reference program loop count.

* * * * *